United States Patent [19]

Bruel et al.

[11] Patent Number: 4,564,763
[45] Date of Patent: Jan. 14, 1986

[54] PROCESS AND APPARATUS FOR VARYING THE DEFLECTION OF THE PATH OF A CHARGED PARTICLE BEAM

[75] Inventors: Michel Bruel, Veurey; Jean-François Michaud, St. Pierre de Seucy, both of France

[73] Assignee: Commissariat a l'Energie Atomique, Paris, France

[21] Appl. No.: 517,394

[22] Filed: Jul. 26, 1983

[30] Foreign Application Priority Data

Aug. 17, 1982 [FR] France .................................. 82 14204

[51] Int. Cl.⁴ .............................. G21K 1/08; H01J 3/00
[52] U.S. Cl. ............................................. 250/396 ML
[58] Field of Search ..................... 250/396 R, 396 ML; 313/361.1

[56] References Cited

U.S. PATENT DOCUMENTS

| | | | |
|---|---|---|---|
| 3,021,445 | 2/1962 | Wideröe et al. | 250/596 ML |
| 3,671,737 | 6/1972 | Hull | 250/396 R |
| 3,671,895 | 6/1972 | Aucouturier et al. | 250/596 ML |

FOREIGN PATENT DOCUMENTS 0002990 12/1978 European Pat. Off. .
693474 of 1979 U.S.S.R. ....................... 250/396 ML

OTHER PUBLICATIONS

IBM Technical Disclosure Bulletin, vol. 19, No. 9, Feb. 1977, J. R. Winnard: "Ion-Beam Scanning by Magnetic Means", pp. 3411-3412.

Nuclear Instruments and Methods, vol. 189, No. 1, Oct. 1981, P. R. Hanley: "Electromagnetic Scanning Systems", pp. 227-237.

Primary Examiner—Bruce C. Anderson
Attorney, Agent, or Firm—Oblon, Fisher, Spivak, McClelland & Maier

[57] ABSTRACT

Process and apparatus for varying the deflection of the path of a charged particle beam over a path of length l in a space volume V, where there is a magnetic induction B (x,y,z), wherein a relative displacement of volume V with respect to the beam is produced in such a way as to vary the magnitude $\int BDl$ calculated along the path and characterizing the deflection undergone by the beam on passing through volume V. In some of the embodiments rotating magnetic pole pieces are employed to vary the path. Fixed inclined faced pole pieces are also employed.

3 Claims, 8 Drawing Figures

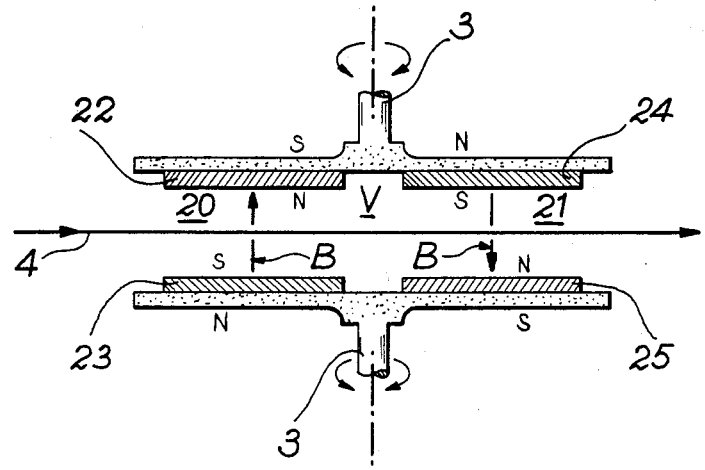
FIG. 4a
FIG. 4b
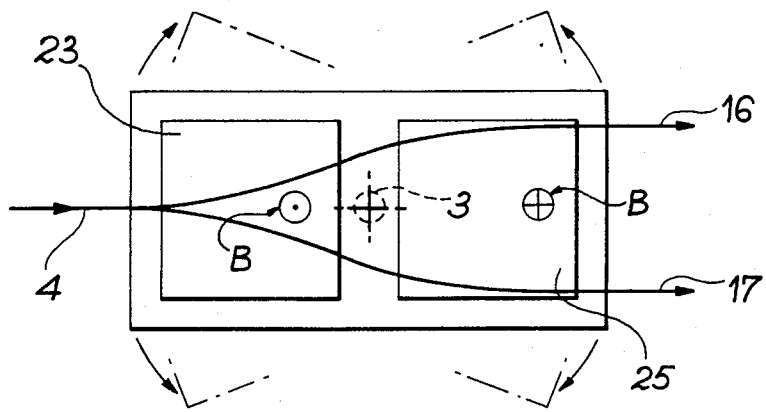

PROCESS AND APPARATUS FOR VARYING THE DEFLECTION OF THE PATH OF A CHARGED PARTICLE BEAM

BACKGROUND OF THE INVENTION

The present invention relates to the procedures used for obtaining the deflection of the path of charged particle beams, such as for example, the intense ion beams used in ion implanters.

It is known that heavy ion beams of the same sign, reaching or exceeding a certain density, for example approximately 1 mA/cm$^2$, are difficult to maintain in the state, in view of the very high repulsive forces exerted between the various particles and which, without special precautions, tend to bring about the splitting of the beam. Such beams can only exist if they have a minimum of space charges of particles with the opposite sign to that of the beam particularly electrons in the case of a beam of positive heavy ions. In general, these electrons are present within the beam, due to the fact that a total vacuum can never be formed in the enclosure in which the beam is displaced and that part of the ionized residual air supplies the necessary electrons.

In order to be able to manipulate such high density, heavy ion beams, it is consequently important not to destroy the compensation by this space charge of particles of the opposite sign, which consequently prevents the use of electrical fields for obtaining deflections of the beam required for the use thereof. Thus, at present, the path of the beam is deflected by magnetic fields, which make it possible to retain the aforementioned compensation, while ensuring an adequate deflection.

Thus, according to the prior art, the beam is deflected by varying the radius of curvature of the path which it follows by creating a zone where the magnetic field varies as a function of time. This is generally brought about by means of a magnetic circuit having an air gap and in which circulates the flux induced by a magnetizing coil, into which is injected the variable intensity current, which produces the variable magnetic field.

All these known deflection processes or apparatus lead to serious disadvantages involving losses by eddy currents and hysteresis in the magnetic material exposed to the variable field, and which are by no means negligible, and the use of a relatively high reactive power during the variation of the magnetic field. As an example of this latter disadvantage, reference can be made to the case of the deflection of a beam of antimony ions of 200 keV with an angle of roughly 1° at 50 Hz. If the magnetized space volume corresponds to an air gap of length approx. 0.2 m, width 0.2 m, air gap thickness 0.1 m, the obtaining of a maximum field of 1000 Gauss or 0.1 Tesla in said air gap leads to the use of a reactive power of approximately 5.8 kVA. A reactive power of this order of magnitude is very prejudicial to the equilibrium of the power supply network from which it is taken.

SUMMARY OF THE INVENTION

The present invention relates to a process and apparatus making it possible to vary the deflection of the path of a charged particle beam by using the magnetic field for said deflection. However, by using simple and effective means, it makes it possible to obviate the aforementioned prior art advantages with regards to losses by hysteresis, eddy currents and unbalance of the network due to the high reactive power consumed.

For varying the deflection of the path of a charged particle beam on a path of length l in a space volume V in which there is a magnetic induction $\vec{B}$ (x,y,z), this process and apparatus is characterized in that a relative displacement of this volume V is produced with respect to the beam, in such a way as to vary the magnitude $\int B dl$ calculated along the path and characteristic of the deflection undergone by the beam when passing through said volume V.

The deflection angle $\alpha$ of a charged particle beam passing through a magnetic induction zone of volume V, length l and intensity B perpendicular to the path is a function, for a given energy and ion type, of the value of the integral $\int B dl$ calculated along this path. In the prior art, variations of the angle were obtained as a function of time, by varying the induction B, also as a function of time. According to the invention, the integral $\int B dl$ is varied along the path taken by the beam of charged particles in order to obtain a variation of the angle $\alpha$. Thus, according to the invention, a beam deflection angle $\alpha$ is obtained, which is a function of the position of the beam with respect to the volume V. Thus, by creating a relative displacement of volume V relative to the beam, it is possible to vary the value of the integral $\int B dl$ and the sought deflection is obtained.

It should be noted that, according to the invention, the induction $\vec{B}$ (x,y,z) is not a function of time, as was the case in the prior art, and that it can be obtained as a result of a magnetizing system independent of time, such as a permanent magnet or a magnetic circuit magnetized by a constant number of ampere turns. Variants of the process according to the invention can be envisaged without passing beyond the scope thereof.

According to a first variant, the magnetic induction is uniform in an e.g. rectangular parallelepipedic volume V, which is rotated about an axis perpendicular to two of its faces and to the direction of the beam.

In a second variant and with the magnetic induction non-uniform in volume V, the latter is rotated about an axis perpendicular to the beam and parallel to the induction.

In a third variant, volume V is fixed in space, but the induction is non-uniform and the beam is displaced relative to volume V before it enters the latter.

In a fourth variant, volume V rotates about an axis perpendicular to the beam and has two adjacent zones which are substantially equal in which the induction, parallel to the rotation axis, is in opposite directions in each of them.

BRIEF DESCRIPTION OF THE DRAWINGS

The invention is described in greater detail hereinafter relative to non-limitative embodiments and with reference to the attached drawings, wherein show:

FIGS. 4a and 4b in elevation and plan view, a system for performing the deflection process according to the invention, incorporating two substantially equal, adjacent zones in which the induction is in opposite directions.

DETAILED DESCRIPTION OF THE INVENTION

Figure 1A:
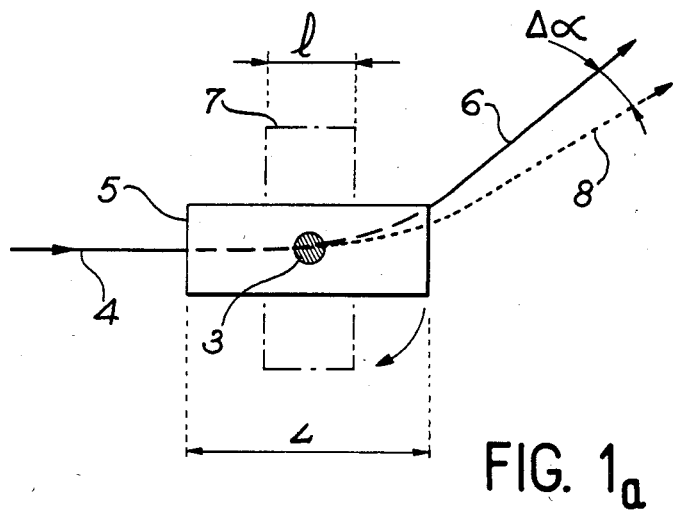
FIG. 1a (plan view) and FIG. 1b (elevation) an example of the variable deflection of the path of a charged particle beam using a rectangular parallelepiped-shaped volume V.
Figure 1B:
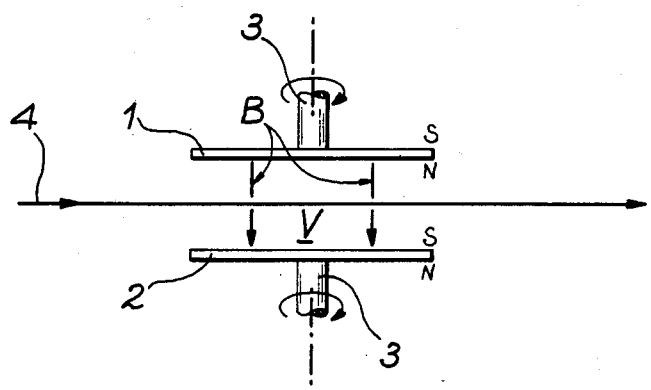

FIGS. 1a and 1b show a volume V magnetized with the aid of two ferrites 1 and 2, having north and south poles in the manner indicated in the drawings. Thus, in volume V, there is a uniform induction B, indicated by the arrows. According to the invention, the two ferrites 1, 2 rotate about an axis 3 perpendicular to their common plane and passing through their centre of symmetry, so that they are rendered integral in rotation. Rotation axis 3 is perpendicular to the general direction of the beam 4 entering the system. When the two ferrites occupy the position 5 indicated by the continuous line in FIG. 1a, the value of integral $\int Bdl$ is maximum and the path of the beam at the exit is designated by the reference numeral 6. However, when the ferrites 1 and 2 which have rotated by 90° about an axis 3, are in position 7, indicated by broken lines in FIG. 1a, integral $\int Bdl$ has its minimum value, because the traversed length 1 is itself minimum and the path of the beam at the exit is designated by reference numeral 8. Thus, by a simple rotation of the system constituted by the two ferrites 1 and 2, i.e. the magnetized volume V, a deflection is obtained, which can vary by an angle $\Delta \alpha$ between the extreme deflections 6 and 8.

Figure 2A:
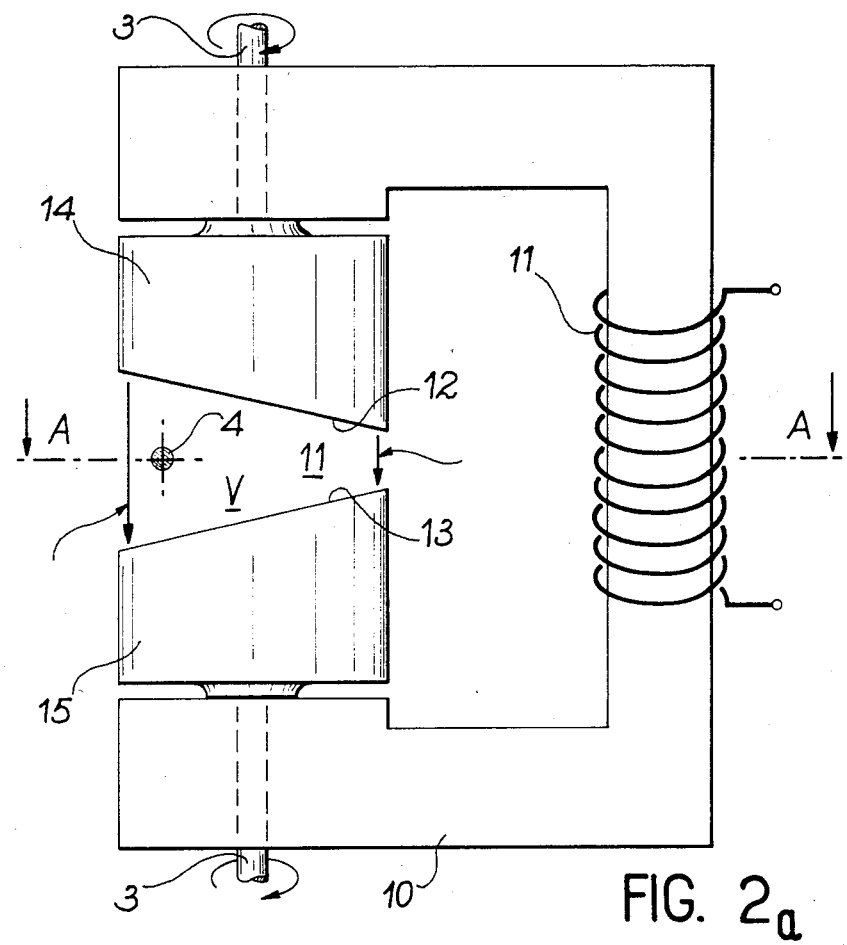
FIG. 2a an embodiment of the process and apparatus according to the invention, in which a variable deflection of the charged particle beam path is obtained by rotating a volume in which the magnetic induction is not uniform.
Figure 2B:
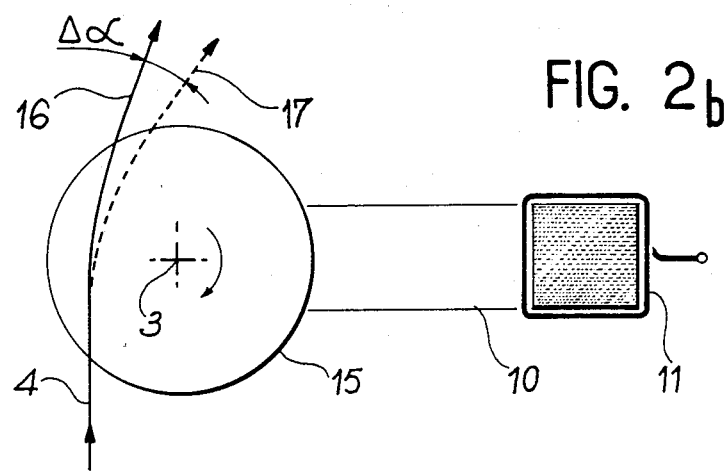
FIG. 2b a section through the device of FIG. 2a along AA.

FIGS. 2a and 2b show another embodiment of the process according to the invention, in which the magnetized volume V rotated about an axis 3 perpendicular to the incident beam 4 and parallel to the induction vector B. The device shown in elevation in FIG. 2a and in plan view along section line AA in FIG. 2b, essentially comprises a fixed magnetic circuit 10, having a preferably circular cross-section, in which a constant current I corresponding to an electromagnetic force of nI ampere turns, is circulated with the aid of a coil 11 having a certain number n of turns. This magnetic circuit 10 has an air gap 11 defined by two inclined planes 12 and 13 belonging to pole pieces 14, 15 arranged in such a way as they can integrally rotate about rotation axis 3 located in the plane of FIG. 2a. The configuration of air gap 11 leads to the obtaining of a magnetic induction B in accordance with the arrows. However, it is not uniform throughout volume V of air gap 11 because its intensity, i.e. the modulus of vector V, varies in an inverse manner to the local thickness of the air gap. In other words, in the position of poles 11 and 15 shown in FIG. 2a, the induction beam is minimum on the outer face located to the left of the air gap and maximum on the inner face located to the right thereof. The charged particle beam whose deflection is to be varied in volume V is offcentered with respect to axis 3 in 4, so that it is merely necessary to rotate poles 14 and 15 about axis 3 in order that the modulus of vector V seen by beam 4 varies in time, thereby bringing about a deflection of a varying degree of beam 4. FIG. 2b shows the minimum deflection 16 corresponding to the minimum induction B and the maximum deflection 17 corresponding to the maximum induction B in volume V at beam 4. The minimum deflection 16 and maximum deflection 17 are angularly spaced by an angle $\Delta \alpha$ which defines the limits of the variation of the deflection of the path, which can be imposed on the instant beam 4 by the device of FIGS. 2a and 2b.

Figure 3A:
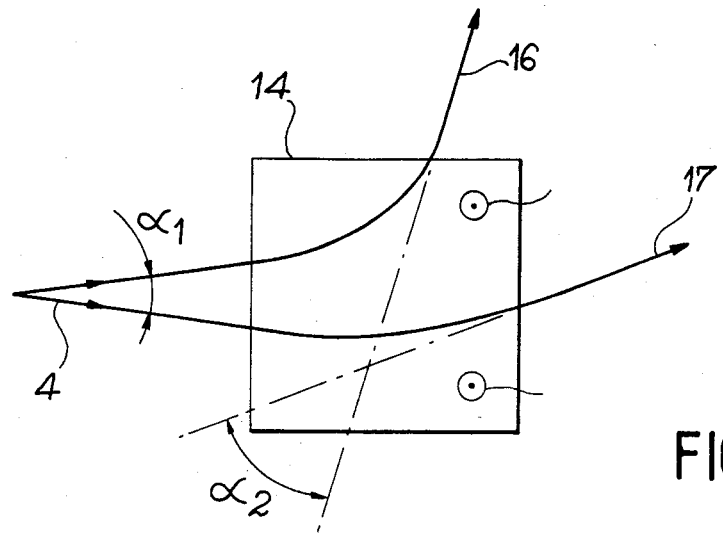
FIGS. 3a and 3b in elevation and plan view, a device for increasing the scanning, in which the volume V is fixed in space, the induction is non-uniform and the beam is displaced before it enters the system.
Figure 3B:
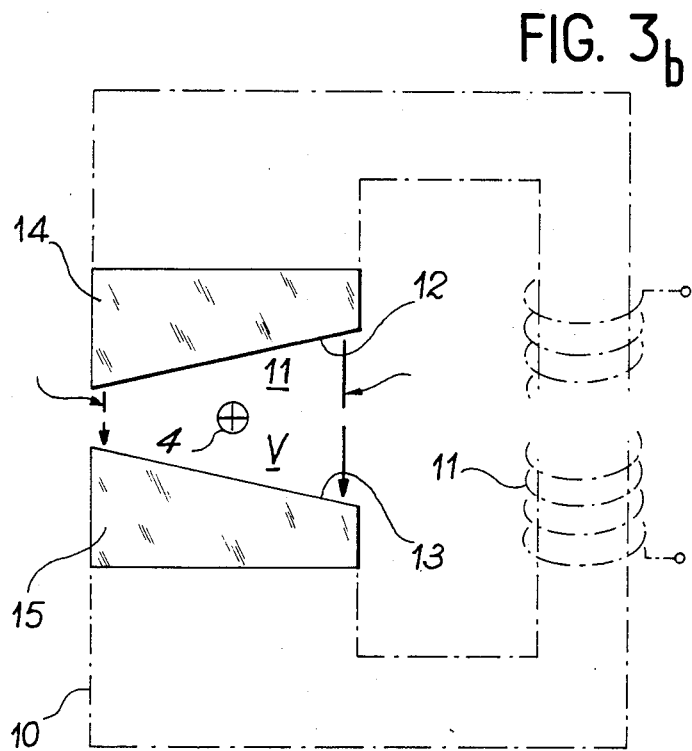

The device of FIGS. 3a and 3b serves to increase the deflection of the initial beam, obtained in per se known manner by mechanical or electrical means not forming part of the invention. This device has the special feature of being entirely static and as in the case of FIGS. 2a and 2b, has a fixed magnetic circuit 10, energized by a coil 11, traversed by a current of intensity I and corresponding to a magnetomotive force of nI ampere turns.

As in the preceding case, magnetic circuit 10 is provided with an air gap 11, defined by magnetic poles 14, 15 delimited by facing inclined planar surfaces 12, 13, defining in air gap 11 a magnetic induction B, whose direction is indicated by the arrows and whose non-uniform intensity varies from one end to the other of air gap 11. The essential difference compared with the preceding device is that in the case of FIGS. 3a and 3b, the pole pieces 14, 15 are fixed and it is beam 4 which is so displaced in the plane of FIG. 3a by an angle $\alpha 1$ limited to a few degrees. However, it is increased in the system, because the angle $\alpha 2$, delimited by the extreme deflection 16, 17 of the charged particle beam is much larger than the angle $\alpha 1$ of the initial deflection opening angle $\alpha 1$. Thus, when before entering the system of FIGS. 3a and 3b, beam 4 oscillates by an angle $\alpha 1$ of a few degrees, the emanating beam scans the space between the limiting beams 16, 17, thus being displaced by an angle $\alpha 2$ much larger than the initial deflection angle $\alpha 1$ ($\alpha 2$ is often higher than 10 $\alpha 1$).

This device can be used when it is wished to obtain, on the basis of known chemical or electrical means bringing about a slight initial deflection, a much larger, automatic angular deflection of a charged particle beam.

The device of FIGS. 4a and 4b shows another embodiment of this invention and essentially comprises, in the manner shown in FIG. 4a in a volume V rotating about an axis 3, two contiguous areas 20, 21 of equal volume in which the induction B is of the same intensity, but opposite directions in the individual zones. This can easily be obtained, e.g. with the aid of four ferrites, whose north and south poles are distributed in the manner indicated in FIG. 4a. On considering what happens when a charged particle beam 4 enters the system, cf the plan view of FIG. 4b, it is clear that this beam is deflected in opposite directions in each of the zones 20, 21, so that for a first position of the system of four ferrites 22, 23, 24, 25, this leads to the extreme path 16 and to the extreme path 17 for the same position of these four ferrites following a rotation of half a turn around axis 3. Thus, for the intermediate positions of volume V, the path of the beam is deflected between the extreme paths 16, 17.

In all the embodiments described hereinbefore with reference to the drawings, it is consequently apparent that the variation of the deflection of the path of the charged particle beam is obtained by magnetic means varying the integral $\int Bdl$, seen by the beam, in volume V, without there being any reactive power consumption, or hysteresis loss, or eddy current loss, because the magnetic fields are obtained either by permanent magnets, or by electromagnetic circuits supplied by constant currents.

What is claimed is:

1. A device for deflecting a charged particle beam comprising:
   a fixed magnetic circuit means;
   two pole pieces having inclined faces positioned opposite each other which are coupled to said fixed magnetic circuit means which are separated from each other by way of an air gap;
   rotating means coupled to said pole pieces for integrally rotating said pole pieces about their axes;
   constant current means coupled to said fixed magnetic circuit means, for providing a constant current through a coil having a plurality of turns;
   wherein the deflection of a charged beam passing through said air gap is varied in time.

2. A device for deflecting a charged particle beam comprising:
   a fixed magnetic circuit means;
   two pole pieces having inclined faces positioned opposite each other which are coupled to said fixed magnetic circuit means which are separated from each other by way of an air gap;
   constant current means coupled to said fixed magnetic circuit means, for providing a constant current through a coil having a plurality of turns;
   means for oscillating by an angle $\alpha 1$ the charged beam; and
   wherein the deflection of the charged beam passing through said air gap varies in time by an angle $\alpha 2$ and wherein $\alpha 1 < \alpha 2$.

3. A device for deflecting a charged particle beam comprising:
   a fixed magnetic circuit means;
   a first pair of ferrites forming a first pole piece;
   a second pair of ferrites forming a second pole piece wherein said first pair of ferrites and said second pair of ferrites form an air gap and wherein the first half of said first pair of ferrites north oriented pole is positioned opposite that of the south oriented pole of the first half of said second pair of ferrites and wherein said second half of said first pair of ferrites south oriented pole is positioned opposite that of said second half of said second pair of ferrites north oriented pole;
   rotating means coupled to said pole pieces for integrally rotating said pole pieces about their axis;
   constant current means coupled to said fixed magnetic circuit means, for providing a constant current through a coil having a plurality of turns;
   wherein the deflection of a charged beam passing through said air gap is varied in time.

* * * * *